(12) United States Patent
Shinogi (10) Patent No.: US 8,373,278 B2
(45) Date of Patent: Feb. 12, 2013

(54) SEMICONDUCTOR DEVICE HAVING STACKED DICE DISPOSED ON BASE SUBSTRATE

(75) Inventor: Hiroyuki Shinogi, Gunma (JP)

(73) Assignees: SANYO Semiconductor Co., Ltd., Ora-gun (JP); Semiconductor Components Industries, LLC, Phoenix, AZ (US)

( * ) Notice: Subject to any disclaimer, the term of this patent is extended or adjusted under 35 U.S.C. 154(b) by 436 days.

(21) Appl. No.: 12/048,861

(22) Filed: Mar. 14, 2008

(65) Prior Publication Data
US 2008/0224322 A1 Sep. 18, 2008

(30) Foreign Application Priority Data
Mar. 15, 2007 (JP) ................................. 2007-066408

(51) Int. Cl.
*H01L 23/48* (2006.01)
(52) U.S. Cl. ................................. 257/777; 257/E23.169
(58) Field of Classification Search .................. 257/777, 257/788, E23.169; 438/15
See application file for complete search history.

(56) References Cited

U.S. PATENT DOCUMENTS

| | | | | |
|---|---|---|---|---|
| 5,331,205 A | * | 7/1994 | Primeaux | 257/790 |
| 5,436,203 A | * | 7/1995 | Lin | 29/841 |
| 5,495,398 A | * | 2/1996 | Takiar et al. | 361/790 |
| 6,445,594 B1 | | 9/2002 | Nakagawa et al. | |
| 7,276,799 B2 | | 10/2007 | Lee et al. | |
| 2003/0189259 A1 | * | 10/2003 | Kurita et al. | 257/777 |
| 2004/0026789 A1 | * | 2/2004 | Michii | 257/777 |
| 2004/0231872 A1 | * | 11/2004 | Arnold et al. | 174/35 R |
| 2005/0051883 A1 | * | 3/2005 | Fukazawa | 257/686 |
| 2006/0012018 A1 | * | 1/2006 | Karnezos et al. | 257/678 |
| 2007/0045791 A1 | * | 3/2007 | Saeki | 257/668 |
| 2007/0228579 A1 | * | 10/2007 | Kang | 257/777 |

FOREIGN PATENT DOCUMENTS

| | | | |
|---|---|---|---|
| JP | 04171970 | * | 6/1992 |
| JP | 10112515 | * | 4/1998 |
| JP | 11-176882 | | 7/1999 |
| JP | 2001-156248 | | 6/2001 |
| JP | 2001-223324 | | 8/2001 |
| JP | 2005-072596 | | 3/2005 |
| JP | 2005-347442 | * | 12/2005 |

* cited by examiner

*Primary Examiner* — Kimberly Rizkallah
*Assistant Examiner* — Duy T Nguyen
(74) *Attorney, Agent, or Firm* — Morrison & Foerster LLP (57) ABSTRACT

Semiconductor dice judged as good dice are stacked on a base substrate in which through holes and through hole electrodes are formed. Next, a protection layer to cover the semiconductor dice is formed. It is preferable that the protection layer is composed of a plurality of resin layers (a first resin layer and a second resin layer) that are different in hardness from each other. Then, a conductive terminal that is connected with the through hole electrode is formed on a back surface of the base substrate. Next, the second resin layer and the base substrate are cut along predetermined dicing lines and separated into individual semiconductor devices in chip form. A process step of separation into the semiconductor devices is performed while each of the semiconductor dice is mounted on the base substrate in wafer form.

10 Claims, 7 Drawing Sheets

SEMICONDUCTOR DEVICE HAVING STACKED DICE DISPOSED ON BASE SUBSTRATE

CROSS-REFERENCE OF THE INVENTION

This application claims priority from Japanese Patent Application No. 2007-066408, the content of which is incorporated herein by reference in its entirety.

BACKGROUND OF THE INVENTION

1. Field of the Invention

This invention relates to a semiconductor device having a structure of stacked layers of semiconductor dice.

2. Description of the Related Art

Figure 9:
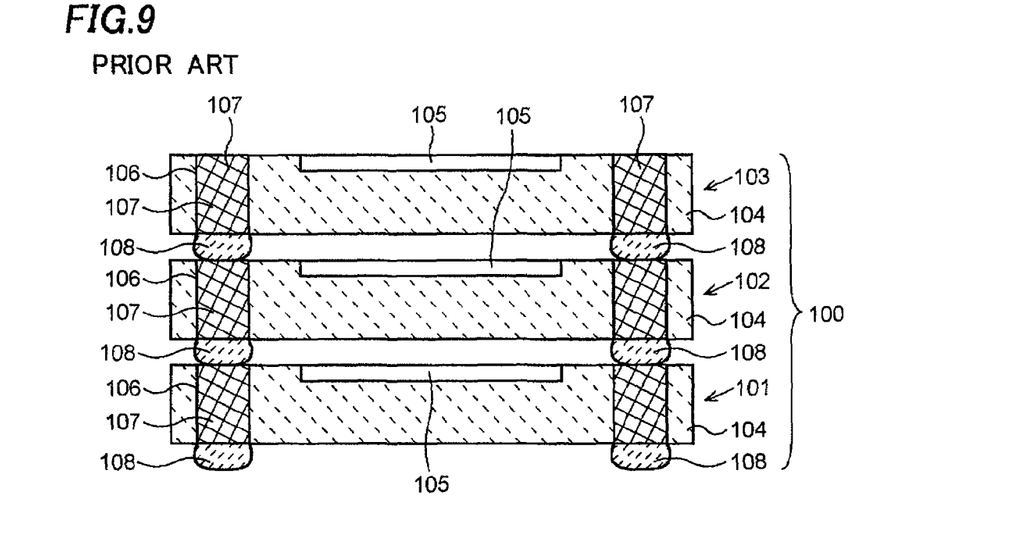
FIG. 9 is a cross-sectional view showing a conventional semiconductor device.
Figure 10:
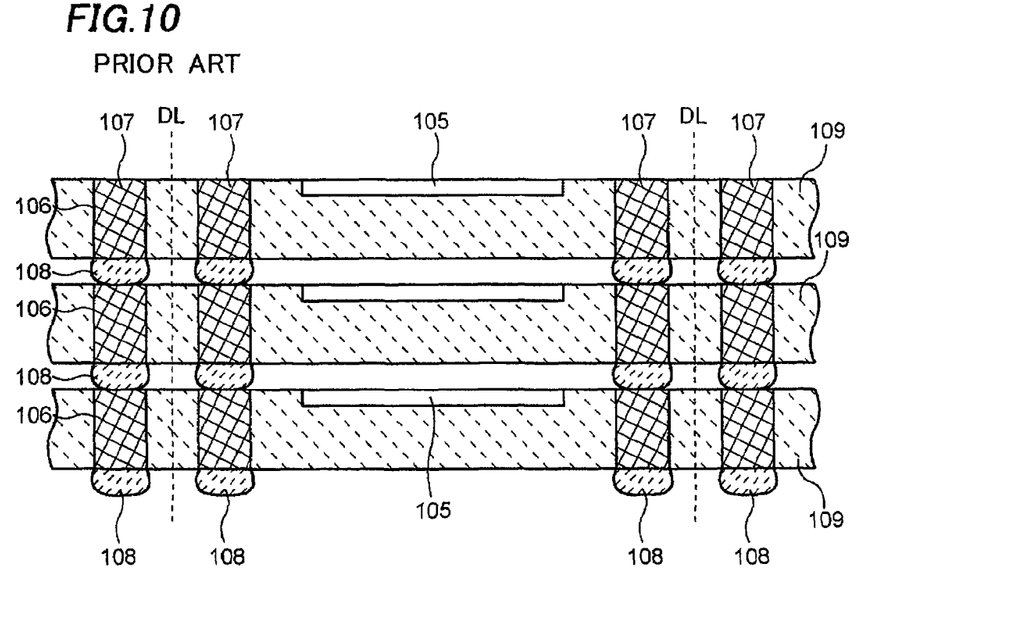
FIG. 10 is a cross-sectional view showing the conventional semiconductor device and its manufacturing method.

The semiconductor device having the structure of stacked layers of semiconductor dice (hereafter referred to as a stacked layer structure) has been known from a standpoint of seeking higher integration and further size reduction of the semiconductor device. An example of conventional semiconductor device having the stacked layer structure will be explained referring to the drawings. FIG. 9 is a cross-sectional view showing an outline of the conventional semiconductor device 100 having the stacked layer structure.

The semiconductor device 100 has the structure of stacked layers of semiconductor dice (a first semiconductor die 101, a second semiconductor die 102 and a third semiconductor die 103). Each of the semiconductor dice 101, 102 and 103 is provided with a semiconductor substrate 104 made of silicon (Si) or the like device elements 105 composed of a multitude of elements such as MOS transistors and capacitors formed on one of surfaces of the semiconductor substrate 104, through holes 106 penetrating through the semiconductor substrate 104, through hole electrodes 107 each formed in each of the through holes 106 and conductive terminals 108 each made of solder or the like and connected with each of the through hole electrodes 107. The semiconductor dice 101, 102 and 103 are electrically connected with each other through the through hole electrodes 107 and the conductive terminals 108.

Following method has been proposed as a manufacturing method of the semiconductor device 100 that has the stacked layer structure described above. The individual semiconductor device 100 is obtained through process steps to sequentially stack semiconductor substrates 109 in wafer form, in which the device elements 105, the through holes 106, the through hole electrodes 107 and the conductive terminals 108 are already formed and subsequent process steps to continuously cut each of the semiconductor substrates 109 along a dicing line DL that makes a border between the individual semiconductor devices 100.

The technology mentioned above is described in Japanese Patent Application Publication No. 2005-347442, for example.

However, the conventional semiconductor device 100 shown in FIG. 9 is vulnerable to lateral mechanical stress which would peel off the stacked layer of semiconductor die in some cases. Especially, the closer to a top layer, the more vulnerable the semiconductor die is against the mechanical stress. As a result, there has been a problem that the stacked layer structure is destroyed to cause a failure in the semiconductor device while the semiconductor device is in field use or in manufacturing. Note that the problem is increasingly apparent when a larger number of semiconductor dice are stacked, because even a single failed die out of the semiconductor dice constituting the stacked layer structure causes a failure of the device as a whole.

In addition, there has been a problem that a corrosive material such as a chemical solution or water infiltrates into the semiconductor device to deteriorate a metal portion (the conductive terminal 108 or a wiring formed on a surface or a back surface of the semiconductor die) constituting each of the semiconductor dice 101, 102 and 103, reducing the reliability and yield of the semiconductor device.

As described above, the process steps to stack the semiconductor substrates 109 in the wafer form has been conceived to be included in the manufacturing method of the semiconductor device 100. However, even a single failed die out of the semiconductor dice constituting the stacked layer structure causes a failure of the device as a whole. The failed die is formed at a random location in the semiconductor substrate in wafer form. With the manufacturing method described above, therefore, there has been a problem that the yield and reliability of finally completed semiconductor devices are low.

This invention is directed to offering a semiconductor device having the stacked layer structure and its manufacturing method that bring high yield and reliability.

SUMMARY OF THE INVENTION

This invention is directed to solving the problems addressed above and has following features. This invention offers a semiconductor device having a base substrate provided with a wiring layer, a plurality of dice that are stacked on the base substrate and electrically connected with the wiring layer and a protection layer that covers the plurality of dice, wherein the protection layer includes a plurality of resin layers that are different in hardness from each other.

This invention also offers a semiconductor device having a base substrate provided with a wiring layer, a plurality of dice that are stacked on the base substrate and electrically connected with the wiring layer and a protection layer that covers the plurality of dice, wherein the plurality of dice includes at least a first die, a second die disposed immediately above the first die, a portion of a side surface of one of the first and second dice being recessed from a side surface of another of the first and second dice, and a third die disposed adjacent the one of the first and second dice in a region where the first and second dice do not overlap.

Features of a manufacturing method of a semiconductor device of this invention are described below. This invention offers a manufacturing method of a semiconductor device including a process step to test dice, a process step to stack a plurality of dice on a base substrate in wafer form using dice judged as good in the process step to test the dice, a process step to form a first resin layer that covers the plurality of dice, a process step to form a second resin layer that is different in hardness from the first resin layer and covers the first resin layer, and a process step to cut the base substrate along a predetermined line.

This invention also offers a manufacturing method of a semiconductor device including a process step to test dice, a process step to stack a plurality of dice on a base substrate in wafer form using dice judged as good in the process step to test the dice, a process step to form a protection layer that covers the plurality of dice and a process step to cut the base substrate along a predetermined line, wherein the process step to stack the plurality of dice includes at least stacking a first die, stacking a second die disposed immediately above the first die, a portion of a side surface of one of the first and second dice being recessed from a side surface of another of the first and second dice, and stacking a third die disposed adjacent the one of the first and second dice in a region where the first and second dice do not overlap.

DETAILED DESCRIPTION OF THE INVENTION

A semiconductor device and its manufacturing method according to a first embodiment of this invention will be explained referring to the drawings. FIGS. 1A through FIG. 4 are a plan view and cross-sectional views of the semiconductor device presented in an order of manufacturing process steps. Although the manufacturing process steps are performed using a substrate in wafer form on which a plurality of the semiconductor devices is to be formed in matrix form bordered with dicing lines DL, only one of the semiconductor devices is described hereafter for the simplicity of explanation.

First, there is provided a substrate (hereafter referred to as a base substrate) 1 in wafer form, which is to make a base of the semiconductor device according to the embodiment and has not been separated into individual dice yet. The base substrate 1 is made of silicon (Si) or glass, for example. Or the base substrate 1 may be a printed circuit board.

Figure 1A:
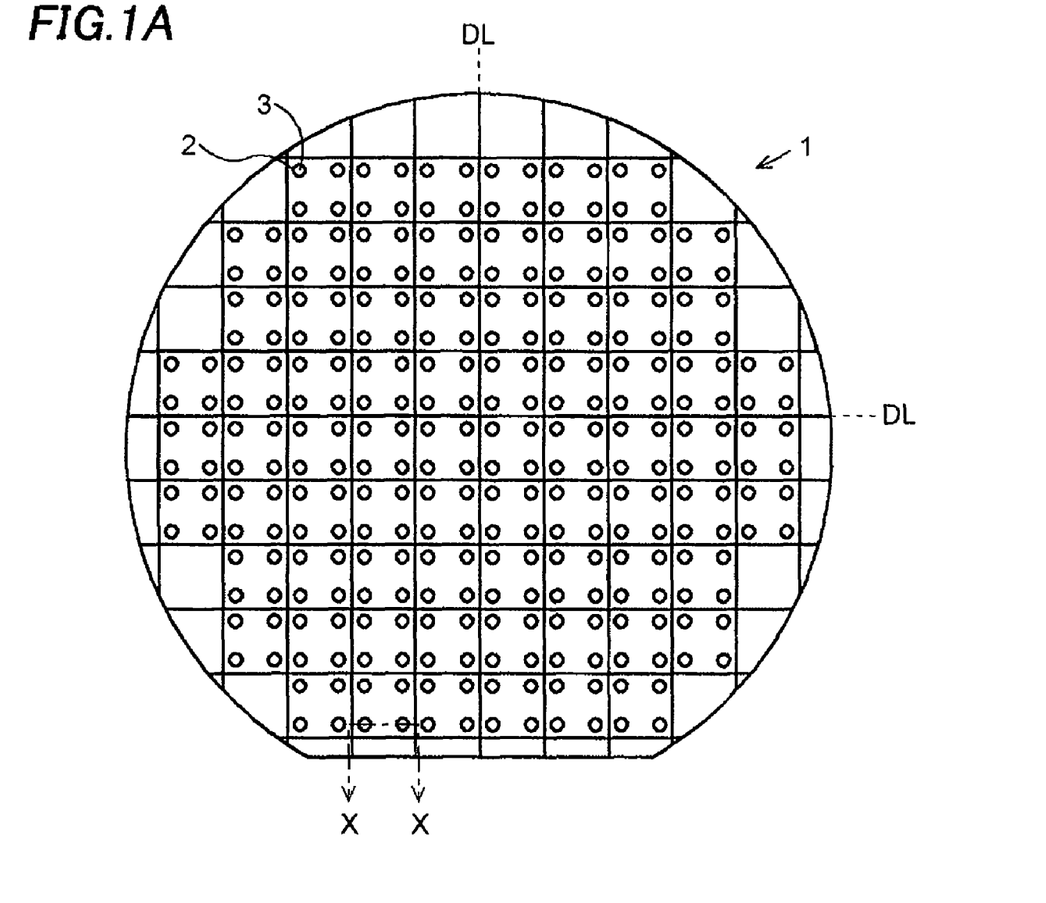
FIG. 1A is a plan view showing a semiconductor device and its manufacturing method according to a first embodiment of this invention.
Figure 1B:
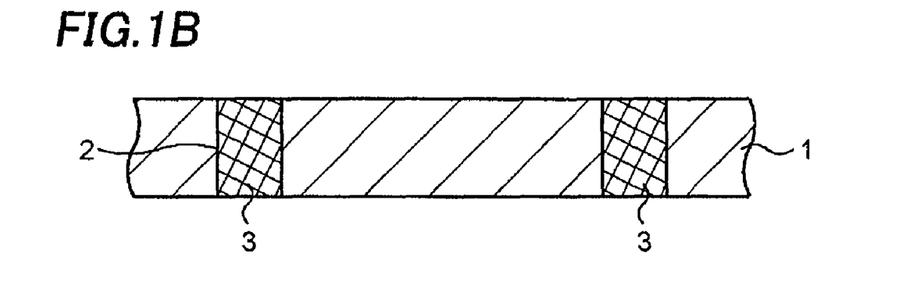
FIG. 1B is a cross-sectional view showing the semiconductor device and its manufacturing method according to the first embodiment of this invention.

Next, through holes 2 and through hole electrodes 3 made of aluminum, copper or the like are formed in the base substrate 1 by a manufacturing process well known in the art, as shown in FIGS. 1A and 1B. FIG. 1B is a cross-sectional view of a section X-X shown in FIG. 1A. Device elements composed of a multitude of elements such as transistors and capacitors and wirings may be formed on one of surfaces (a surface on which the semiconductor die is stacked later) of the base substrate 1.

The through holes 2 may be formed by dry-etching of the base substrate 1 using a resist layer (not shown) as a mask, for example. The through hole electrodes 3 may be formed by a plating method, for example. When the base substrate 1 is made of a conductive material such as silicon, an insulation film such as a silicon oxide film or a silicon nitride film is formed by a CVD (Chemical Vapor Deposition) method, for example, in order to prevent electrical conduction between the through hole electrode 3 and the base substrate 1.

In this embodiment, the through hole electrode 3 is viewed as a wiring layer. When a wiring connected with the through hole electrode 3 is formed on one or both of the surfaces of the base substrate 1, this wiring is viewed as part of in the wiring layer.

Next, there are provided semiconductor dice (a first semiconductor die 4a, a second semiconductor die 4b and a third semiconductor die 4c in this embodiment) that are to be stacked on the base substrate 1. Each of the semiconductor dice 4a, 4b and 4c is an individual die that has been separated already and is preferably a die determined to have good device characteristics at a testing step prior to this stacking step. That is because reliability and yield of finally obtained semiconductor device can be improved by selectively using only the dice determined to be good. The good die means a die that satisfies certain product specifications regarding basic functions, characteristics, appearance and the like required for an integrated circuit.

The semiconductor dice 4a, 4b and 4c are formed to be approximately equal to each other in dimensions along horizontal directions (hereafter simply referred to as outside dimensions), and side surfaces of the semiconductor dice 4a, 4b and 4c are to be aligned on a common plane when they are stacked. The horizontal directions mean directions parallel to the surface of the base substrate 1. Cases in which a semiconductor die having different outside dimensions is stacked will be described in second and third embodiments.

Device elements 5 are formed in one of the surfaces (a surface not facing the base substrate 1 in this embodiment) of each of the semiconductor dice 4a, 4b and 4c. The device elements 5 are not limited in terms of types or functions of devices, and are composed of a multitude of elements such as transistors, capacitors and memory devices, for example. The device elements 5 in each of the semiconductor dice 4a, 4b and 4c may have common kinds of functions to those in other dice, or may have different functions from those in other dice.

Each of the semiconductor dice 4a, 4b and 4c is provided with a through hole 6 that is similar to the through hole 2, a through hole electrode 7 that is similar to the through hole electrode 3 and a conductive terminal 8 electrically connected with the through hole electrode 7 at approximately the same location. The conductive terminal 8 is made of a conductive material such as solder, and serves for electrical connection between the base substrate 1 and the semiconductor die 4a and for mutual electrical connection among the semiconductor dice 4a, 4b and 4c. The conductive terminal 8 may be formed by a plating method, a screen printing method, a dispensing method or the like. Although an insulation film such as a silicon oxide film or a silicon nitride film is formed on an inner wall of the through hole 6, the insulation film is omitted from the drawing.

Figure 2:
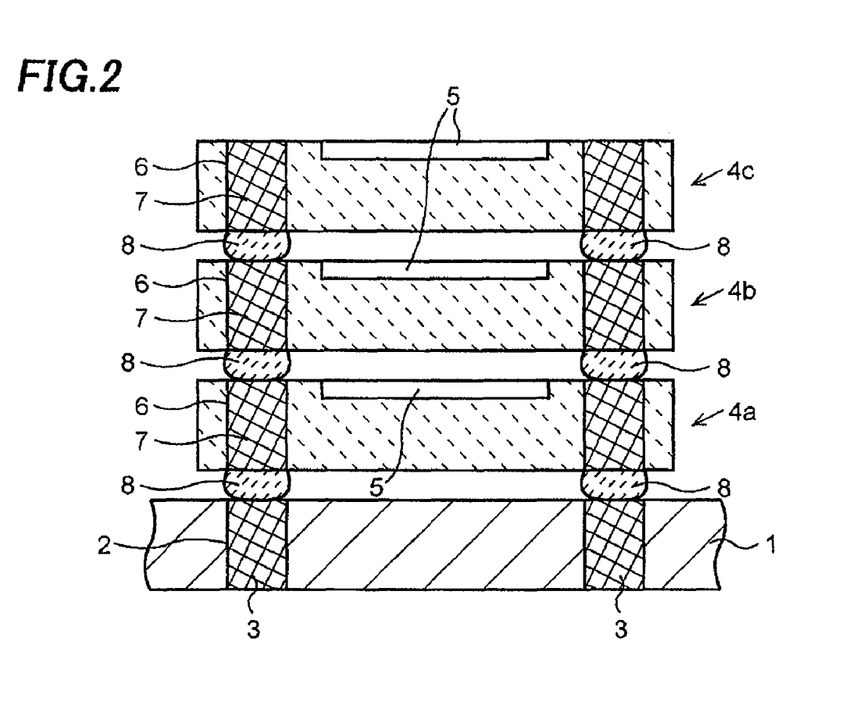
FIG. 2 is a cross-sectional view showing the semiconductor device and its manufacturing method according to the first embodiment of this invention.

Next, the first semiconductor die 4a is stacked on the base substrate 1, each of the through holes 3 is connected with overlapping each of the through holes 7 through each of the conductive terminals 8, respectively, and the first semiconductor die 4a is fixed to the base substrate 1, as shown in FIG. 2. Following the above, the second semiconductor die 4b is fixed onto the first semiconductor die 4a and the third semiconductor die 4c is fixed onto the second semiconductor die 4b similarly. As described above, a stacked layer structure composed of a plurality of semiconductor dice 4a, 4b and 4c connected with the through hole electrodes 3 is obtained. A bonding layer composed of solder, resin or the like may be used in fixing each of the semiconductor dice 4a, 4b and 4c.

Next, a protection layer 10 to cover the semiconductor dice 4a, 4b and 4c is formed. As described below, it is preferable that the protection layer 10 is composed of a plurality of resin layers (a first resin layer 11 and a second resin layer 12) that are different in hardness from each other.

Figure 3:
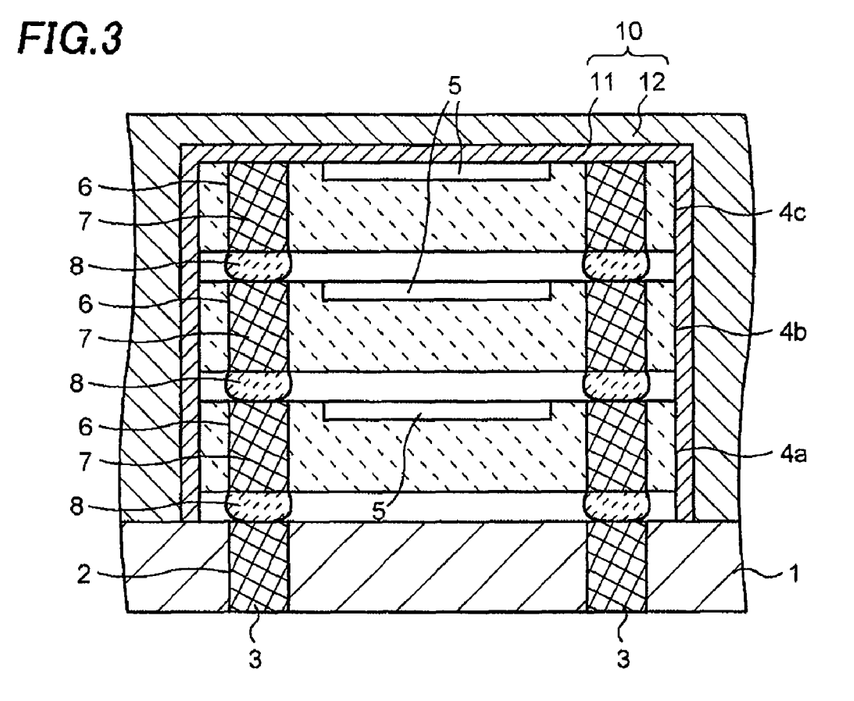
FIG. 3 is a cross-sectional view showing the semiconductor device and its manufacturing method according to the first embodiment of this invention.

In forming the protection layer 10, the first resin layer 11 is formed to a thickness of 30 μm, for example, so as to cover a surface of the third semiconductor die 4c at the top and whole the side surfaces of the semiconductor dice 4a, 4b and 4c, as shown in FIG. 3. The first resin layer 11 is composed of an epoxy mold resin, for example, and is formed by a transfer molding method or by a dispensing method that uses a dispenser, for example. The first resin layer 11 is for reducing a mechanical stress transferred from outside to the semiconductor dice 4a, 4b and 4c, and is preferably made of a polymeric material with low bridging density and low hardness.

Next, the second resin layer 12 to cover the first resin layer 11 is formed to a thickness of 70 μm, for example. The second resin layer 12 is composed of an epoxy mold resin, for example, and is formed by the transfer molding method or by the dispensing method, for example, as in the case of the first resin layer 11. The second resin layer 12 is made of a material with higher bridging density and higher hardness compared with the first resin layer 11. For that, the second resin layer 12 is less vulnerable to deformation due the mechanical stress from outside compared with the first resin layer 11. The protection layer 10 composed of the plurality of resin layers that are different in hardness from each other is formed as described above.

The first resin layer 11 and the second resin layer 12 are not limited to being composed of the epoxy resin as described above, and may be composed of a polyimide resin, a silicone resin or the like. Also, the protection layer 10 may be composed of more than two resin layers or may be composed of a single resin layer.

Figure 4:
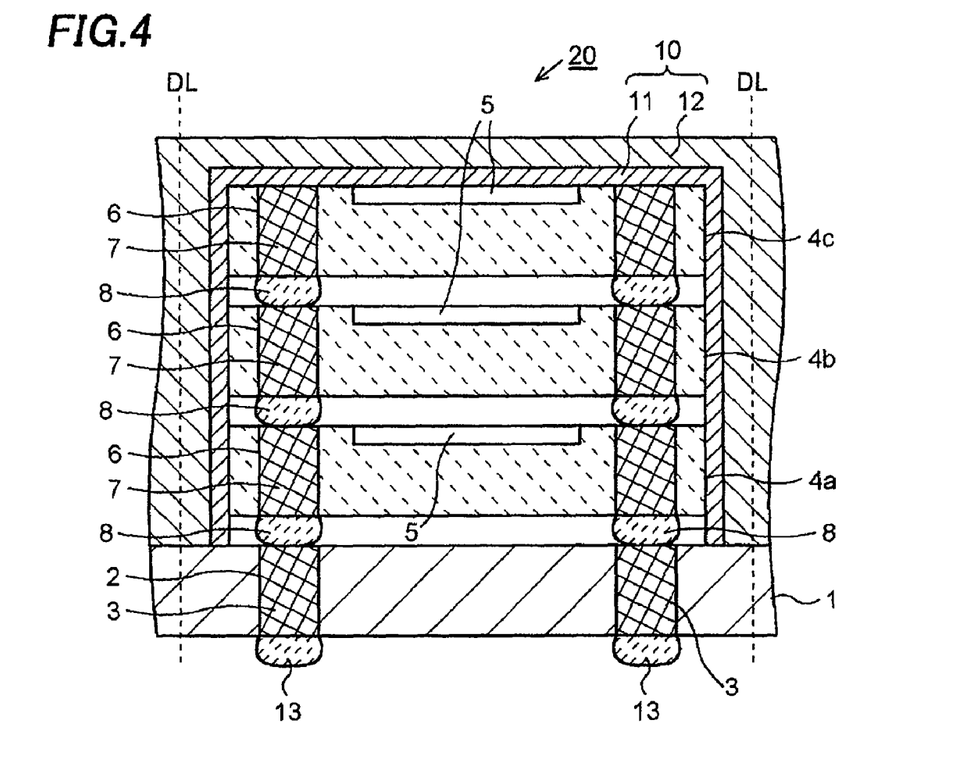
FIG. 4 is a cross-sectional view showing the semiconductor device and its manufacturing method according to the first embodiment of this invention.

Next, a conductive terminal 13 connected with the through hole electrode 3 is formed on a back surface of the base substrate 1, as shown in FIG. 4. The conductive terminal 13 serves as an external connection terminal of the semiconductor device, and is formed by screen printing a conductive material (solder, for example) on the through hole electrode 3 and reflowing the conductive material by heat treatment. Or, the conductive terminal 13 may be formed by an electrolytic plating method or by a so-called dispensing method in which solder or the like is applied to a predetermined region using a dispenser. In the case where a wiring (an aluminum wiring, for example) extending over the back surface of the base substrate 1 is formed by a sputtering method or the like, the conductive terminal 13 may be formed on the wiring instead of forming the conductive terminal 13 directly on the through hole electrode 3. The conductive terminal 13 is electrically connected with each of the semiconductor dice 4a, 4b and 4c through the through hole electrodes 3 and 7 and the conductive terminals 8. The conductive terminal 13 may be formed before the protection layer 10 is formed.

Next, the second resin layer 12 and the base substrate 1 are cut along the predetermined dicing lines DL and separated into individual semiconductor devices 20 in chip form. As described above, a process step of separation into the semiconductor devices 20 is performed while each of the semiconductor dice 4a, 4b and 4c is mounted on the base substrate 1 in wafer form. As a method to separate into individual semiconductor devices 20, there may be used a dicing method, an etching method, a laser cutting method or the like. It is noted that in this separation step the base substrate 1 is cut but the semiconductor dice 4a-4c are not cut because they have already been separated as individual dice from corresponding wafers as explained above.

The semiconductor device 20 having the plurality of semiconductor dice 4a, 4b and 4c stacked on the base substrate 1 according to the first embodiment is completed through the process steps described above. The semiconductor device 20 is mounted through the conductive terminals 13 on a printed circuit board or the like, on which a multitude of circuit elements are formed.

Unlike the conventional structure (Refer to FIG. 9.), each of the semiconductor dice 4a, 4b and 4c constituting the stacked layer structure is not exposed to outside and covered with the protection layer 10 in the semiconductor device 20 according to the first embodiment. Also, the protection layer 10 is composed of the plurality of resin layers (the first resin layer 11 and the second resin layer 12) that are different in hardness from each other. As a result, there can be realized the semiconductor device having the stacked layer structure that is more resistant to the mechanical stress and the infiltration of corrosive material and is higher in reliability and yield compared with the conventional structure (Refer to FIG. 9.).

Instead of stacking the semiconductor substrate in wafer form as in the conventional art, the semiconductor dice determined to be good dice are stacked on the base substrate 1 in wafer form. Therefore, the reliability and yield of the completed semiconductor devices 20 can be improved compared with the conventional manufacturing method.

Figure 5:
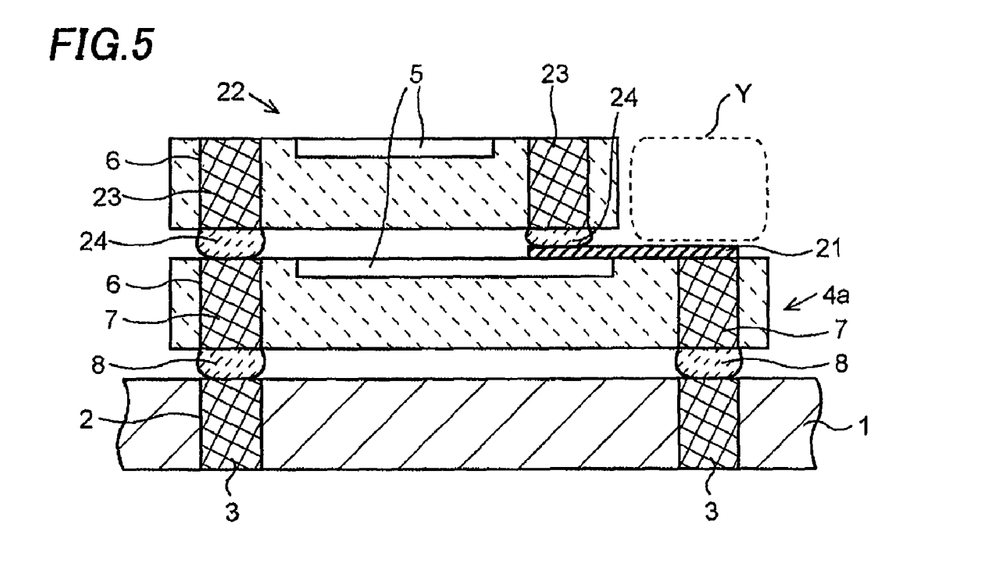
FIG. 5 is a cross-sectional view showing a semiconductor device and its manufacturing method according to a second embodiment of this invention.
Figure 6A:
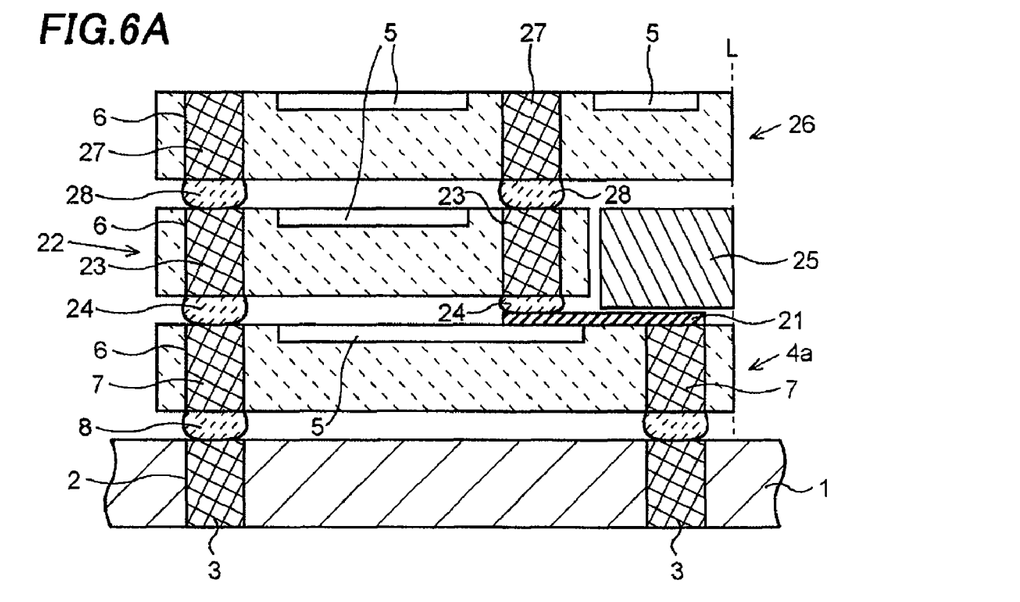
FIG. 6A is a cross-sectional view showing the semiconductor device and its manufacturing method according to the second embodiment of this invention.
Figure 6B:
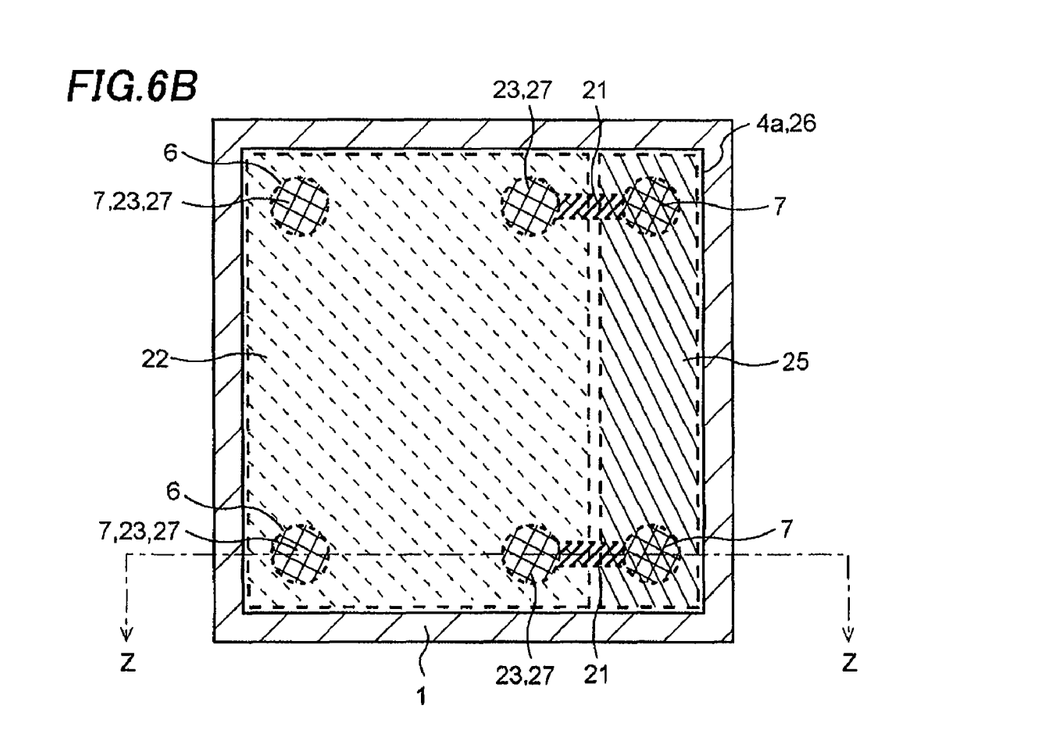
FIG. 6B is a plan view showing the semiconductor device and its manufacturing method according to the second embodiment of this invention.
Figure 7:
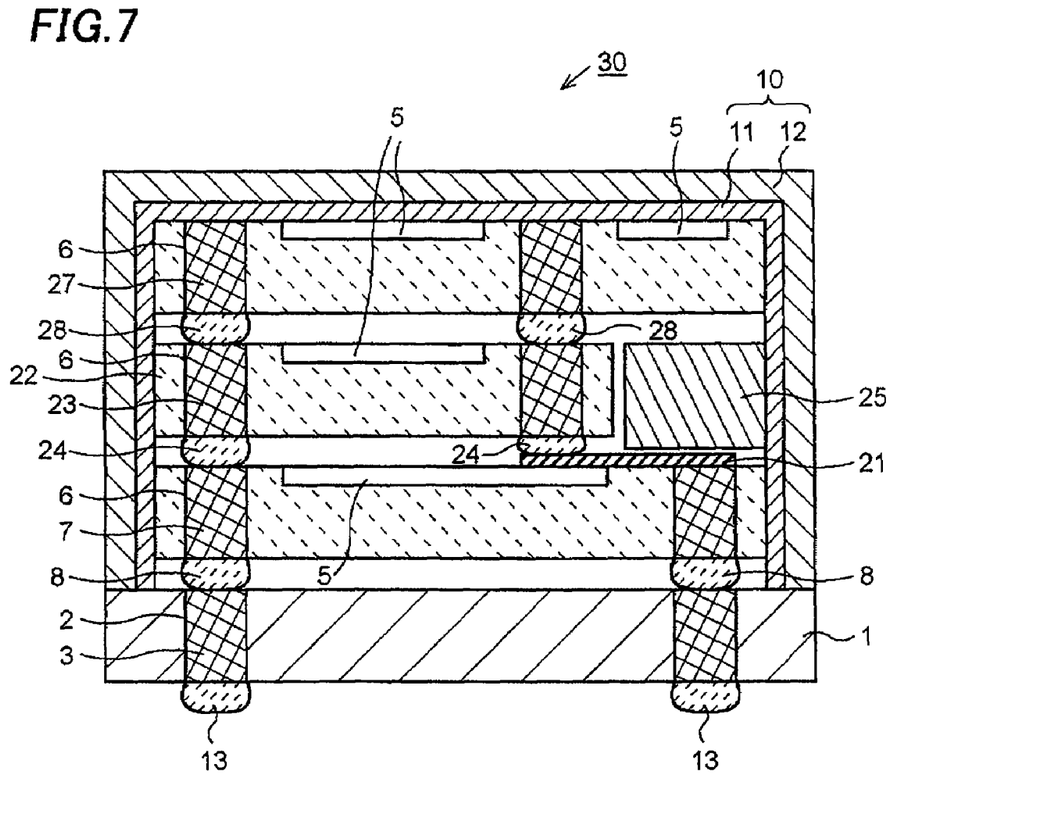
FIG. 7 is a cross-sectional view showing the semiconductor device and its manufacturing method according to the second embodiment of this invention.

Next, a semiconductor device and its manufacturing method according to a second embodiment of this invention will be described referring to the drawings. FIG. 5 through FIG. 7 are cross-sectional views showing the semiconductor device in a sequence of manufacturing process steps. Explanations on the same structure and the same manufacturing process as in the first embodiment are omitted or simplified.

First, a first semiconductor die 4a determined to be a good die is stacked on and connected with a base substrate 1 in wafer form through conductive terminals 8, as shown in FIG. 5. A wiring layer 21 electrically connected with a through hole electrode 7 is formed on a surface of the first semiconductor die 4a. The wiring layer 21 is formed by sputtering a layer of metal such as aluminum and by patterning the metal layer.

Next, a second semiconductor die 22 that is different in outside dimensions from the first semiconductor die 4a is provided. Like the first semiconductor die 4a, the second semiconductor die 22 is provided with device elements 5, through holes 6, through hole electrodes 23 and conductive terminals 24.

Next, the second semiconductor die 22 is disposed on the first semiconductor die 4a so that each of the conductive terminals 24 in the second semiconductor die 22 is connected with corresponding through hole electrode 7 or the wiring layer 21. Because the outside dimensions of the second semiconductor die 22 is different from the outside dimensions of the first semiconductor die 4a, a portion of a side surface of the second semiconductor die 22 is placed inside of the first semiconductor die 4a. And there is caused a region Y on the surface of the first semiconductor die 4a, where the first semiconductor die 4a and the second semiconductor die 22 do not overlap each other. Although the region Y is caused adjacent one of side surfaces of the second semiconductor die 22 in this embodiment, the region Y may be caused adjacent another of the side surfaces since the location of the second semiconductor die 22 is varied depending on locations where the through hole electrodes 23 and the conductive terminals 24 of the second semiconductor die 22 are formed.

Next, a dummy die 25 is placed in the region Y adjacent the second semiconductor die 22 through a bonding layer (not shown) made of epoxy resin or the like, as shown in FIG. 6A and FIG. 6B. Although the dummy die 25 can be placed in contact with the second semiconductor die 22, it is preferable to leave a certain amount (at least 20 μm) of clearance between them. That is because, if the dummy die 25 is in contact with the second semiconductor die 22, a stress caused between them due to a thermal stress or a mechanical stress would displace the dummy die 25 or the second semiconductor die 22 to cause deterioration in the reliability.

Next, a third semiconductor die 26 is stacked on the second semiconductor die 22 and the dummy die 25, and each of through hole electrodes 27 is connected with overlapping each of the through hole electrodes 23 through each of conductive terminals 28, respectively. The third semiconductor die 26 in this embodiment has the same outside dimensions as the first semiconductor die 4a. FIG. 6B is an outline plan view showing relative position of the stacked dice (the first semiconductor die 4a, the second semiconductor die 22, the dummy die 25 and the third die 26). FIG. 6A is a cross-sectional view of a section Z-Z shown in FIG. 6B.

The dummy die 25 is placed between the semiconductor dice (between the first semiconductor die 4a and the second semiconductor die 22 and between the second semiconductor die 22 and the third semiconductor die 26 in the embodiment) and serves to make outside dimensions of upper layer and outside dimensions of lower layer equal or close to equal. Therefore, although there is no restriction on the outside dimensions of the dummy die 25, it is preferable that the side surface of the dummy die 25 is aligned with a side surface of each of the semiconductor dice (the first semiconductor die 4a and the third semiconductor die 26) above and below the dummy die 25 so that all the side surfaces are on a common plane L. That is because the stacked layer structure is stabilized and a semiconductor device highly resistant to the mechanical stress can be realized with the structure described above.

It is also preferable that an upper surface of the dummy die 25 is placed at the same height as an upper surface of the second semiconductor die 22, that is, the dummy die 25 is placed approximately at the same height as the adjacent semiconductor die. That is because the upper surface of the second semiconductor die 22 and the upper surface of the dummy die 25 together make an approximately level horizontal plane and the third semiconductor die 26 can be placed stably on the approximately level horizontal plane with the structure described above. Also, even if the third semiconductor die 26 is not placed atop the structure, placing the dummy die 25 suppresses a step-like structure on outer surface of the stacked layer structure and makes the stacked layer structure more stable.

Next, as in the first embodiment described above, the base substrate 1 is separated along dicing lines DL after a protection layer 10 (a first resin layer 11 and a second resin layer 12) and conductive terminals 13 are formed. The semiconductor device 30 according to the second embodiment, which has a plurality of semiconductor dice 4a, 22 and 4c stacked on the base substrate 1 as shown in FIG. 7, is completed through the process steps described above.

A characteristic feature of the second embodiment is that the stacked layer structure including the semiconductor die having different dimensions from the other die is provided with the dummy die 25. With such semiconductor device 30, the semiconductor dice that are different in outside dimensions from each other can be stacked stably. In addition, all the semiconductor dice can be covered uniformly with the protection film 10, because placing the dummy die 25 prevents causing a gap between the semiconductor dice.

Displacement between upper and lower stacked semiconductor dice might be caused even when the outside dimensions of the semiconductor dice are approximately the same, depending on locations where electrodes (the conductive terminals 8 in the first embodiment or the conductive terminals 3, 24 and 28 in the second embodiment) for connection between the semiconductor dice are formed. Therefore, the dummy die 25 may be used not only when stacking the plurality of semiconductor dice including one that is different in the outside dimensions from the other, but also when stacking the plurality of semiconductor dice all having the same outside dimensions. That is, the dummy die 25 may be used when a portion of side surface of one of upper and lower semiconductor dice is recessed from a side surface of the other.

Figure 8:
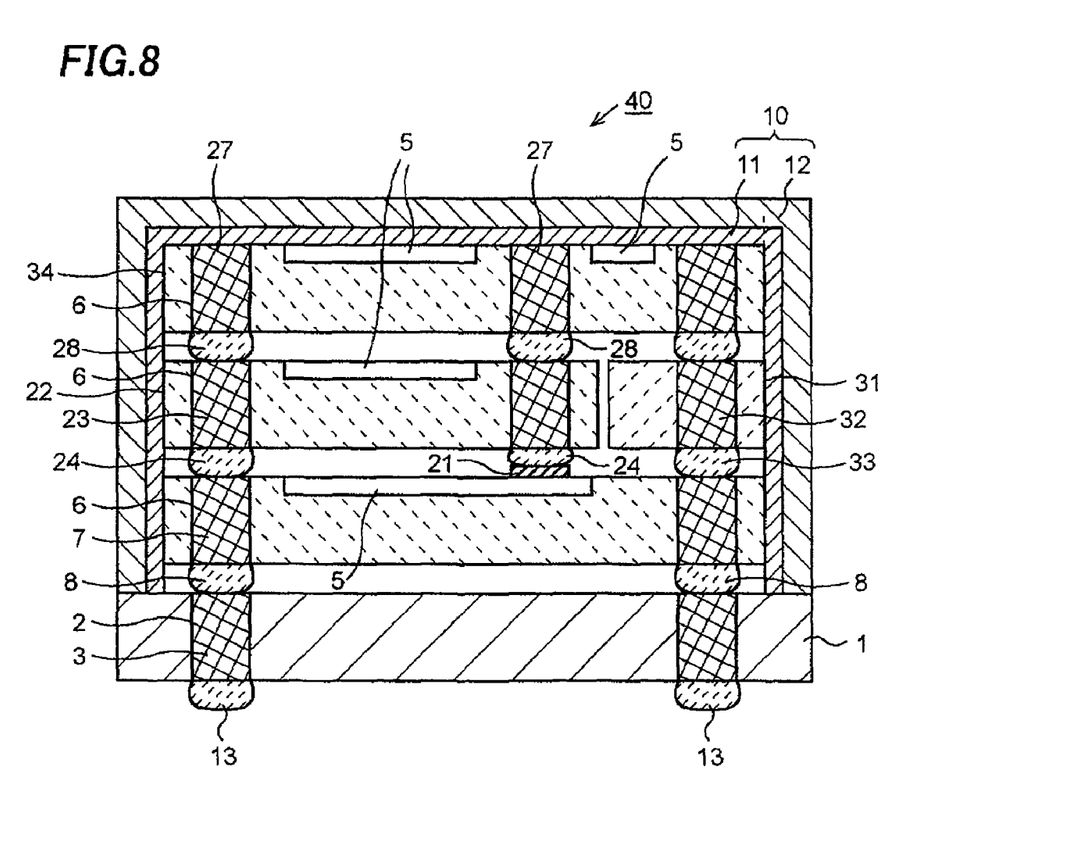
FIG. 8 is a cross-sectional view showing a semiconductor device according to a third embodiment of this invention.

Next, a third embodiment of this invention will be explained referring to the drawings. FIG. 8 is a cross-sectional view showing a semiconductor device 40 according to the third embodiment of this invention. The same components as those in the first or second embodiment are denoted by the same symbols and explanations on them are omitted.

In the second embodiment described above, the dummy die 25 is used primarily for aligning outside edges of the stacking layer structure of the semiconductor dice and stabilizing the stacking layer structure. In the semiconductor device 40 according to the third embodiment, however, a wiring die 31 provided with a through hole electrode 32 and a conductive terminal 33 is placed adjacent a second semiconductor die 22, as shown in FIG. 8. As described above, it is possible to replace the dummy die 25 with the wiring die 31 through which an upper layer die (a semiconductor die 34) and a lower layer die (a semiconductor die 4a) are electrically connected.

It is also possible to replace the wiring die 31 with a semiconductor die having device elements 5 similar to the first, second and third semiconductor dice 4a, 22 and 34. Each layer constituting the stacked layer structure may include a plurality of semiconductor dice placed horizontally.

This invention is not limited to the embodiments described above and may be modified within the scope of the invention. For example, locations where the through holes and the through hole electrodes are formed may be varied in accordance with a design of the semiconductor die. Although the structures in which BGA type semiconductor dice having ball-shaped conductive terminals are stacked are explained in the embodiments described above, this invention may be applied to a structure in which LGA (Land Grid Array) type semiconductor dice are stacked. Although the upper and lower semiconductor dice are electrically connected through the through hole electrodes in the embodiments described above, the upper and lower semiconductor dice may be electrically connected through side surface wirings that is formed on the side surfaces of the semiconductor dice. This invention can be widely applied as a packaging technology to stack a plurality of semiconductor dice.

The protection layer is formed to cover the stacked dice in the embodiments of this invention. As a result, it is made possible to realize the semiconductor device having the stacked layer structure that is more resistant to the mechanical stress from a lateral direction and the infiltration of corrosive material and higher in reliability and yield compared with the conventional structure in which no protection layer is formed.

In the manufacturing methods according to the embodiments of this invention, there is no process step to the stack semiconductor substrates in wafer form as in the conventional manufacturing method. Instead, the semiconductor dice having been separated into individual dice and judged as good dice are stacked on the base substrate in wafer form. As a result, the reliability and yield of finally obtained semiconductor device can be improved.

What is claimed is:

1. A semiconductor device comprising:
   a base substrate comprising a wiring layer;
   a plurality of dice stacked on the base substrate and electrically connected to the wiring layer, wherein the plurality of dice comprise a dummy die not including a metal wiring, and a side surface of the dummy die is aligned with the side surface of the stacked dice; and
   a protection layer covering a top and a side of the stacked dice and comprising a stack of a plurality of epoxy resin layers, each resin layer being insulating, having a different hardness from another resin layer, and covering the top and the side of the stacked dice.

2. The semiconductor device of claim 1, wherein the wiring layer comprises a through hole electrode formed in the base substrate.

3. The semiconductor device of claim 1, wherein one of the dice comprises a through hole electrode formed in the one of the dice.

4. A semiconductor device comprising:
   a base substrate comprising a wiring layer;
   a stack of a first die and a second die disposed on the base substrate and electrically connected to the wiring layer, the stack having a side surface, the second die having a recess portion receding from the side surface, and the first die being disposed between the base substrate and the second die;
   a third die disposed in the recess portion of the second die, the third die being a dummy die physically separated from the second die and not including a metal via wiring, wherein the third die is disposed in the recess portion so that a side surface of the third die is aligned with the side surface of the stack;
   a patterned wiring disposed on the first die so as to extend from a connection point on the second die to a connection point on the first die that is located under the third die; and
   a protection layer covering the first, second and third dies.

5. The semiconductor device of claim 4, further comprising a fourth die disposed on the second die.

6. The semiconductor device of claim 4, wherein the third die is disposed in the recess portion so that a side surface of the third die is aligned with the side surface of the stack.

7. The semiconductor device of claim 4, further comprising a through hole electrode formed in the first die or second die.

8. The semiconductor device of claim 5, further comprising a through hole electrode fonned in the first die or second die.

9. The semiconductor device of claim 1, wherein an innermost resin layer of the plurality of epoxy resin layers has substantially a same thickness throughout the innermost resin layer.

10. The semiconductor device of claim 4, wherein an upper surface of the second die is at the same level as an upper surface of the third die.

* * * * *